(12) United States Patent
Zhang et al.

(10) Patent No.: US 11,636,779 B2
(45) Date of Patent: Apr. 25, 2023

(54) METHOD, APPARATUS AND TERMINAL DEVICE FOR CONSTRUCTING PARTS TOGETHER

(71) Applicant: UBTECH ROBOTICS CORP LTD, Shenzhen (CN)

(72) Inventors: Yanhui Zhang, Shenzhen (CN); Youjun Xiong, Shenzhen (CN)

(73) Assignee: UBTECH ROBOTICS CORP LTD, Shenzhen (CN)

( * ) Notice: Subject to any disclaimer, the term of this patent is extended or adjusted under 35 U.S.C. 154(b) by 742 days.

(21) Appl. No.: 16/677,698

(22) Filed: Nov. 8, 2019

(65) Prior Publication Data

US 2020/0211413 A1 Jul. 2, 2020

(30) Foreign Application Priority Data

Dec. 29, 2018 (CN) .......................... 201811640437.6

(51) Int. Cl.
| | |
|---|---|
| G09B 19/00 | (2006.01) |
| G06F 30/20 | (2020.01) |
| G06T 7/73 | (2017.01) |
| G06T 13/20 | (2011.01) |
| G06T 19/20 | (2011.01) |

(Continued)

(52) U.S. Cl.
CPC ....... G09B 19/0069 (2013.01); A63H 33/042 (2013.01); G06F 30/20 (2020.01); G06T 7/74 (2017.01); G06T 13/20 (2013.01); G06T 19/20 (2013.01); G06V 10/82 (2022.01)

(58) Field of Classification Search
CPC .... G09B 19/0069; G06V 10/82; G06T 13/20; G06T 19/20; G06T 2200/24; G06T 2219/2008; G06T 7/74; G06F 30/20
See application file for complete search history.

(56) References Cited

U.S. PATENT DOCUMENTS

| | | | |
|---|---|---|---|
| 6,980,956 B1 * | 12/2005 | Takagi | ............... G10L 15/26 700/250 |
| 8,429,173 B1 * | 4/2013 | Rosenberg | .......... G06F 16/5866 707/758 |
| 11,107,367 B2 * | 8/2021 | Casella | ............. G09B 19/0053 |

(Continued)

FOREIGN PATENT DOCUMENTS

| | | |
|---|---|---|
| CN | 107818577 A | 3/2018 |
| CN | 108460399 A | 8/2018 |

*Primary Examiner* — Sing-Wai Wu

(57) ABSTRACT

The present disclosure is provides a method, an apparatus and a terminal device for constructing parts together. The method includes: determining an assembly progress of an object constructed of parts; determining a currently required part according to the assembly progress; identifying, in a part photo of the object, the currently required part using a pre-trained first neural network model and marking the one or more identified currently required parts in the part photo; and displaying, via a display, a 3D demonstration animation with the marked part photo as a background image. The method is based on the existing 3D demonstration animation, which identifies the currently required part in the captured part photo and marks the identified currently required part in the part photo, and then displays the marked part photo as the background image of the 3D demonstration animation, thereby adding a prompt for the real part.

20 Claims, 8 Drawing Sheets

(51) Int. Cl.
  *G06V 10/82* (2022.01)
  *A63H 33/04* (2006.01)

(56) References Cited

U.S. PATENT DOCUMENTS

2009/0198365 A1* 8/2009 Seaman ............ G05B 19/41805
                                                  700/116
2019/0172269 A1* 6/2019 Satoh ..................... A63H 33/08
2019/0375103 A1* 12/2019 Cui ....................... G06V 10/764

* cited by examiner

METHOD, APPARATUS AND TERMINAL DEVICE FOR CONSTRUCTING PARTS TOGETHER

CROSS REFERENCE TO RELATED APPLICATIONS

This application claims priority to Chinese Patent Application No. 201811640437.6, filed Dec. 29, 2018, which is hereby incorporated by reference herein as if set forth in its entirety.

BACKGROUND

1. Technical Field

The present disclosure relates to blocks technology, and particularly to a method, an apparatus and a terminal device for constructing parts together.

2. Description of Related Art

At present, after the user purchases the product of the JIMU robot, in order to assist the user to assemble the JIMU robot, the seller will provide the user with a 3D demonstration animation matching the robot which is for assisting the assembly of the robot. The 3D demonstration animation prompts the user for the required component for each step of the assembly by displaying a model photo of the component in the demonstration animation. However, due to the types and numbers of the components of the robot are too many, it is impossible for the user to find the required components quickly, while there are some different types of components that look very similar so that the user needs to spend a long time to identify and determine whether the component is needed in the current assembly step, which results in the extremely low-assembly efficiency.

BRIEF DESCRIPTION OF THE DRAWINGS

To describe the technical schemes in the embodiments of the present disclosure or in the prior art more clearly, the following briefly introduces the drawings required for describing the embodiments or the prior art. It should be understood that, the drawings in the following description merely show some embodiments of the present disclosure. For those skilled in the art, other drawings can be obtained according to the drawings without creative efforts.

DETAILED DESCRIPTION

In the following descriptions, for purposes of explanation instead of limitation, specific details such as particular system architecture and technique are set forth in order to provide a thorough understanding of embodiments of the present disclosure. However, it will be apparent to those skilled in the art that the present disclosure may be implemented in other embodiments that are less specific of these details. In other instances, detailed descriptions of well-known systems, devices, circuits, and methods are omitted so as not to obscure the description of the present disclosure with unnecessary detail.

For the purpose of describing the technical solutions of the present disclosure, the following describes through specific embodiments.

Figure 1:
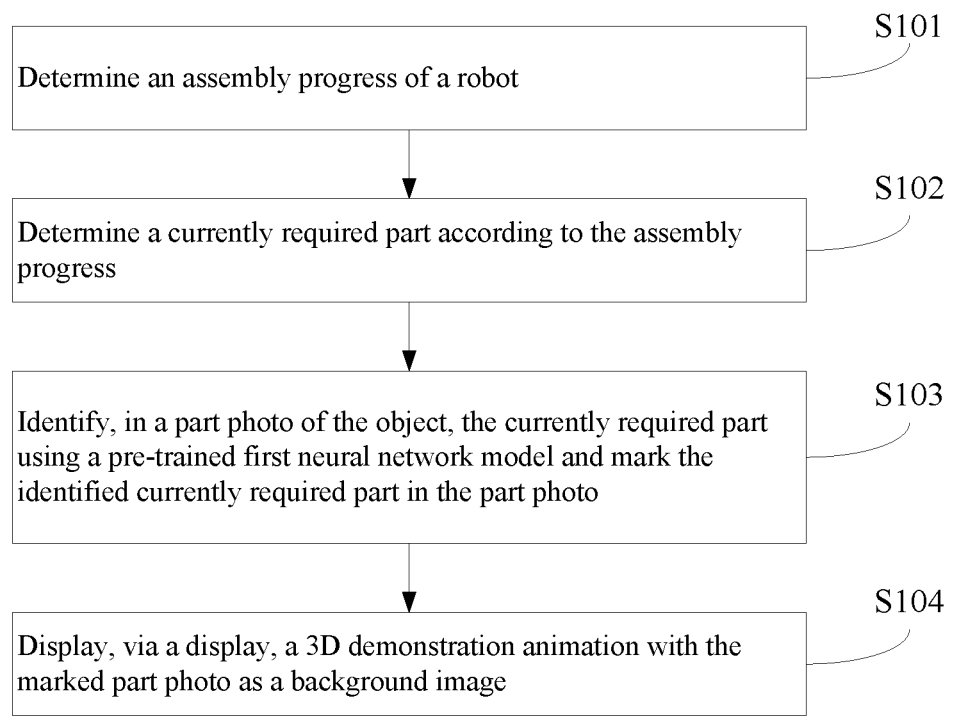
FIG. 1 is a flow chart of an embodiment of a method for constructing parts together according to the present disclosure.
Figure 7:
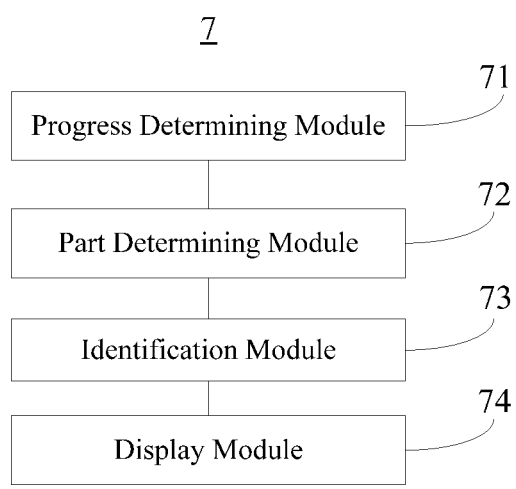
FIG. 7 is a schematic block diagram of an embodiment of an apparatus for constructing parts together according to the present disclosure.
Figure 8:
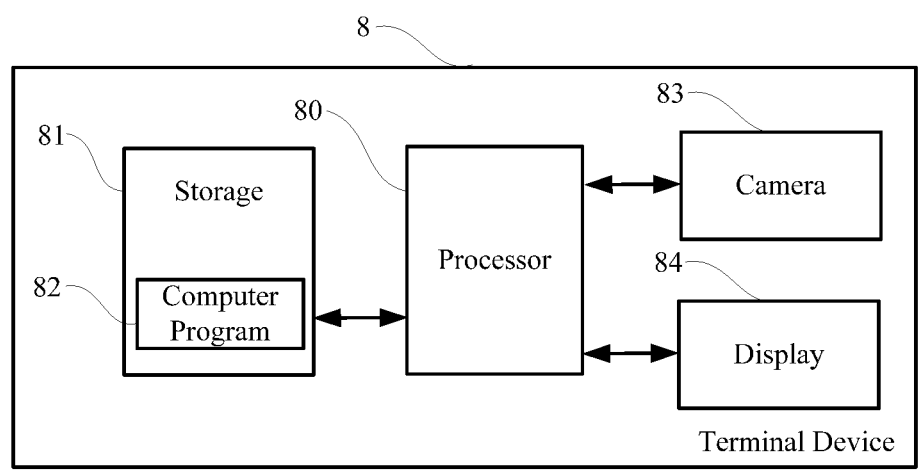
FIG. 8 is a schematic block diagram of an embodiment of a terminal device according to the present disclosure.

FIG. 1 is a flow chart of an embodiment of a method for constructing parts together according to the present disclosure. In this embodiment, a method for constructing parts of a robot (e.g., a humanoid robot) constructed of a plurality of assemblable parts is provided. The method is a computer-implemented method executable for a processor, which may be implemented through and applied to an assembly auxiliary apparatus for a robot as shown in FIG. 7 or a terminal device as shown in FIG. 8, or implemented through a computer readable storage medium. In other embodiments, the method can be used to construct parts of another kind of object constructed of a plurality of assemblable parts (e.g., furniture). As shown in FIG. 1, the method includes the following steps.

S101: determining an assembly progress of the robot.

In other embodiments, if the method is used to construct parts of another kind of object, the assembly progress of the object can be determined. In one embodiment, step S101 may include:

determining the assembly progress of the robot based on a robot photo of each assembly step of the robot using a pre-trained second neural network model.

In which, the robot photo is a photo of the real robot currently to be assembled by the user, which is captured by the camera (of the assembly auxiliary apparatus of FIG. 7 or the terminal device of FIG. 8), and can be received from the camera. In other embodiments, if the method is used to construct parts of another kind of object, the assembly progress of the object can be determined based on an object photo taken for each assembly step of the object using the pre-trained second neural network model.

The robot photo is used as an input of the pre-trained second neural network model, and is identified by the pre-trained second neural network model to determine the assembly progress of the robot. In which, the pre-trained second neural network model refers to the second neural network model after a training is performed thereon, which can identify and determine the current assembly progress of the robot to be assembled by the user.

In this embodiment, before step S101 further includes:

obtaining the pre-trained second neural network model by taking the robot photo of each assembly step as an input of the second neural network model and training the second neural network model with the assembly step as a label.

In other embodiments, if the method is used to construct parts of another kind of object, the pre-trained second neural network mode can be obtained by taking the object photo of each assembly step as the input. To assemble a complete robot, there are many steps required, and each assembly step is to add a new part to the original assembly by assembling the added parts to the original robot. Whenever a new part is added, the photos of the real robot after adding the part are taken from different angles to obtain a plurality of robot photos corresponding to different assembly steps, and then the robot photos are taken as the input of the second neural network model and the existing neural network model is trained using the assembly steps as labels, thereby obtaining the trained second neural network model which is capable of recognizing the assembly progress of the robot.

In one embodiment, step S101 may further include:

determining the assembly progress of the robot based on a built-in 3D demonstration animation.

Figure 2:
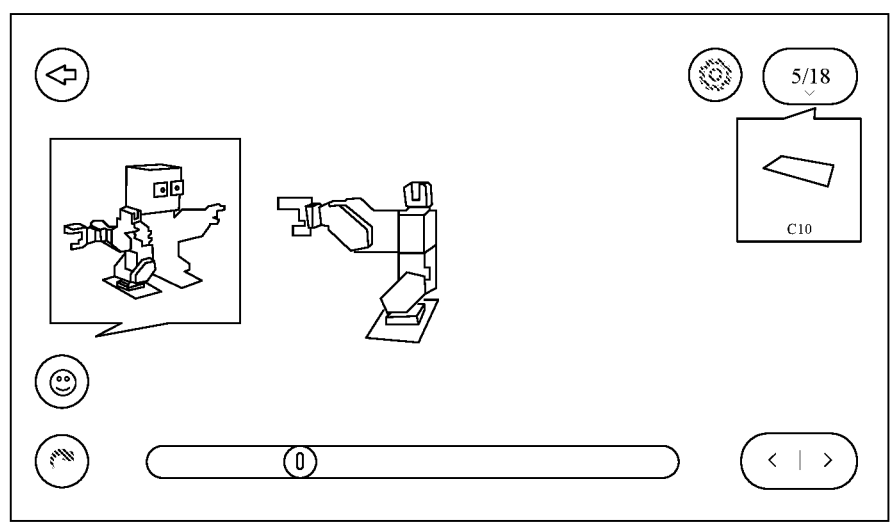
FIG. 2 is a schematic diagram of a 3D demonstration animation for showing an assembly progress according to the prior art.

In other embodiments, if the method is used to construct parts of another kind of object, the assembly progress of the object can be determined based on the built-in 3D demonstration animation. FIG. 2 is a schematic diagram of a 3D demonstration animation for showing an assembly progress according to the prior art. In the prior art, the prompt for the assembly progress of the robot is realized by displaying the current assembly progress of the robot in the central position of an display interface (which displayed by a display device of the assembly auxiliary apparatus of FIG. 7 or the terminal device of FIG. 8), hence the current assembly progress of the robot can be determined according to the content displayed by a 3D demonstration animation including the display interface. The built-in 3D demonstration animation includes a 3D animation for demonstrating the assembly progress of the robot.

S102: determining a currently required part according to the assembly progress.

After determining the assembly progress of the robot, it can determine the currently required part of the robot according to the shape of the robot in the next assembly step. In other embodiments, if the method is used to construct parts of another kind of object, the currently required part of the object can be determined according to the assembly progress.

In which, the currently required part refers to the part of the robot that the user needs to assemble in the next assembly step, and there is generally one currently required part.

Figure 3:
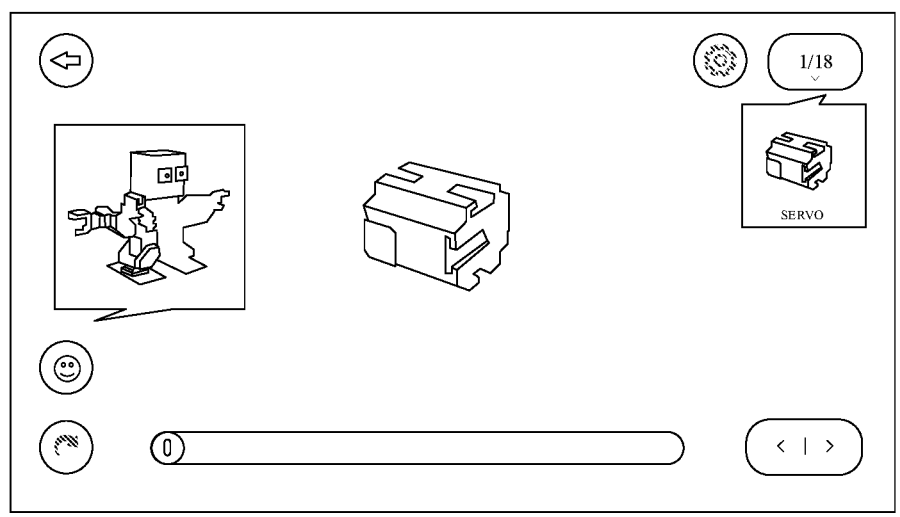
FIG. 3 is a schematic diagram of a 3D demonstration animation for showing a currently required part according to the prior art.

In the prior art, a model photo of the currently required part is displayed on the display interface. FIG. 3 is a schematic diagram of a 3D demonstration animation for showing a currently required part according to the prior art. As shown in FIG. 3, in a certain assembly step in the 3D demonstration animation, a model photo of the robot is at the left side of the display interface, and the model photo of the currently required part is at the right side and the middle of the display interface. According to this original demonstration manner, the user needs to find the corresponding real part according to the model photo of the part in the 3D demonstration animation. Since there are many types and numbers of the parts while some parts have similar appearances, it is usually not easy to find the required part. Hence, the currently required part is determined to identify and mark the currently required part in the part photos of the parts placed by the user, so that the user can quickly find the real part corresponding to the currently required part with reference to the prompt for the real part in the 3D demonstration animation.

S103: identifying, in a part photo of the object, the currently required part using a pre-trained first neural network model and marking the identified currently required part in the part photo.

In which, the pre-trained first neural network model refers to the first neural network model after a training is performed thereon, which is capable of identifying parts. The part photo is a picture of the currently required part in an arranged or non-arranged manner, which can be received from the camera.

In this embodiment, the pre-trained first neural network model takes the part photos according to different shooting angles of each part captured by a camera as an input of the first neural network model to perform a training on the first neural network model with an identifier of the part as a label.

By inputting a plurality of the part photos of the robot to perform training, the resulting pre-trained first neural network model has certain object recognition capabilities and can be used to identify the parts of the robot.

Figure 4:
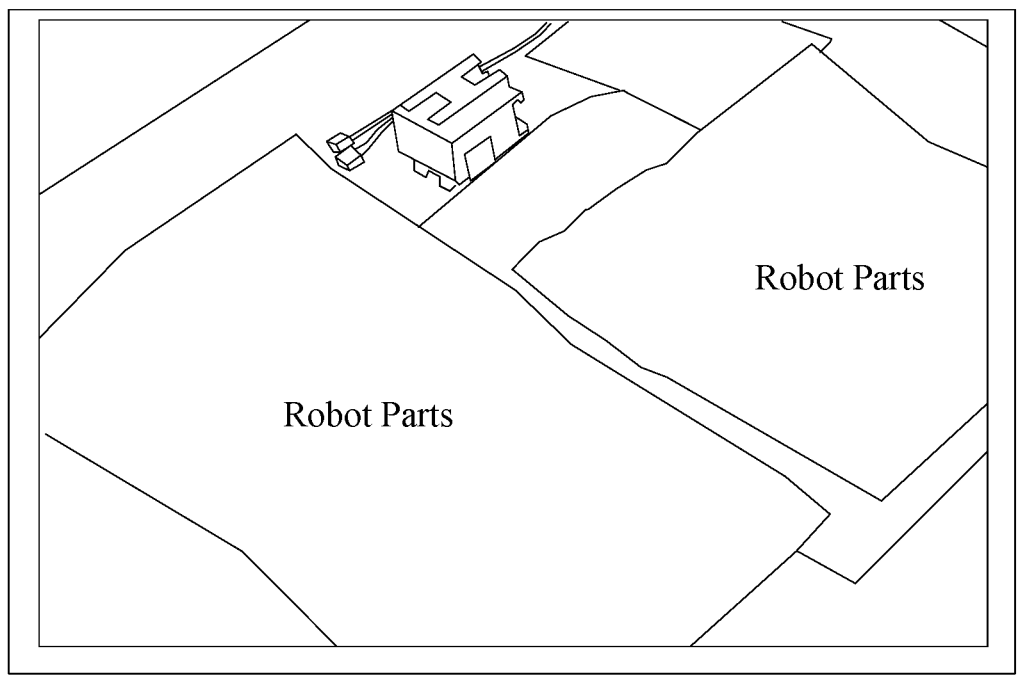
FIG. 4 is a schematic diagram of a part photo for a robot in the method of FIG. 1.

FIG. 4 is a schematic diagram of a part photo for a robot in the method of FIG. 1. As shown in FIG. 4, the user can unpack and place all the parts of the robot on the surface of an object such as a desk, and photographs a scene where the parts are placed through the camera to obtain the part photo. Then, in the method for constructing parts together, the pre-trained first neural network model is used to identify the currently required part in the part photo. After the currently required part in the part photo is identified, in order to allow the user to visually see the currently required part in the part photo, it needs to mark the currently required part in, for example, a box M (see FIG. 5) or a circle.

It should be noted that, the currently required part may not be recognized in the part photo due to the part is blocked by other parts. At this time, the part photo can be taken from another angle and re-identified.

In one embodiment, step 103 may include:

marking all the parts in the part photo that have a visual similarity greater than a preset similarity threshold and selecting the part with the highest similarity as the currently required part, if the similarities of a plurality of the recognized parts are greater than the preset similarity threshold.

In which, the preset similarity threshold can be set as needed, which is not limited herein.

Since there are many types and numbers of the parts of the robot, it is possible to identify a plurality of the parts having similar shapes for the currently required part. Hence, it needs to determine whether a certain part is similar to the currently required part by determining whether the similarity is greater than the preset similarity threshold, and if so, the part is marked. Similarly, all the parts similar to the currently required part can be marked in this method.

After the similar parts are marked, one of the parts with the highest similarity is selected from all the mark parts to take as the currently required part.

S104: displaying, via a display, a 3D demonstration animation with the marked part photo as a background image.

Figure 5:
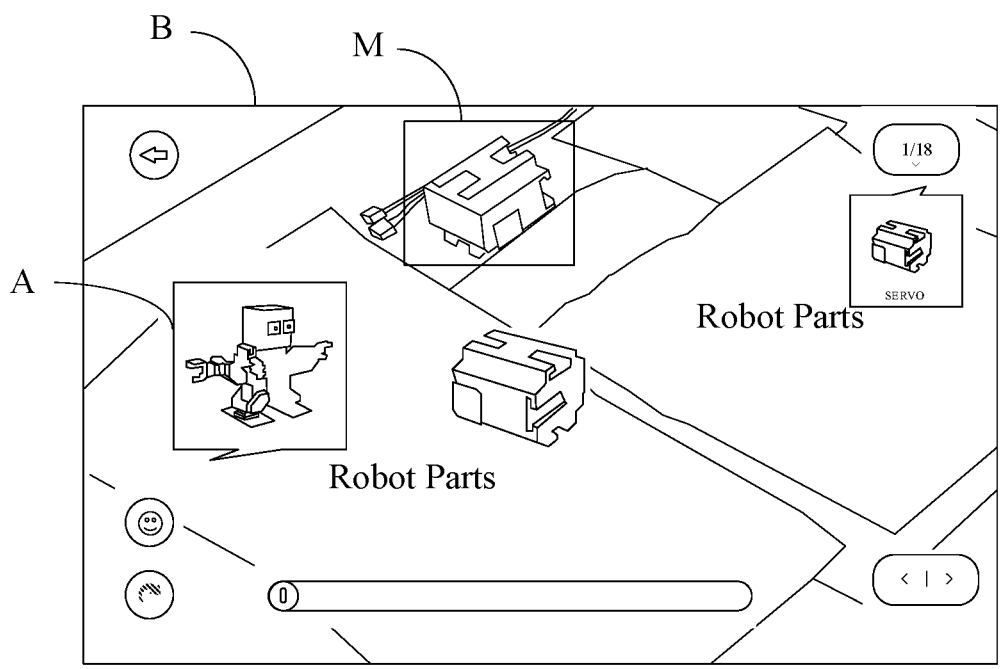
FIG. 5 is a schematic diagram of a 3D demonstration animation with a marked part photo as a background image in the method of FIG. 1.

FIG. 5 is a schematic diagram of a 3D demonstration animation with a marked part photo as a background image in the method of FIG. 1. The marked part photo is then displayed on the display such as a display screen or a device for holography, virtual reality (VR) or augmented reality (AR) by displaying the part photo as a background image B of the 3D demonstration animation A. As shown in FIG. 5, it adds the background image B on the basis of FIG. 4. The background image B is the marked part photo. The user can view the marked part photo through the prompts in the 3D demonstration animation, thereby finding the currently required part directly from the placed parts.

It should be noted that, in the above-mentioned step S103, after the part with the highest similarity is selected as the currently required part, the part with the highest similarity can be displayed in a highlighted manner such as making it has different marking than other similar parts, so as to allow the user to quickly find the part with the largest similarity from the 3D demonstration animation.

The present disclosure is based on the existing 3D demonstration animation, which identifies the currently required part in the captured part photo using the pre-trained first neural network model and marks the identified currently required part in the part photo, and then displays the marked part photo as the background image of the 3D demonstration animation, thereby adding a prompt for the real part, so that the user can quickly find the real part needed for the current assembly step according to the prompt in the background image.

Figure 6:
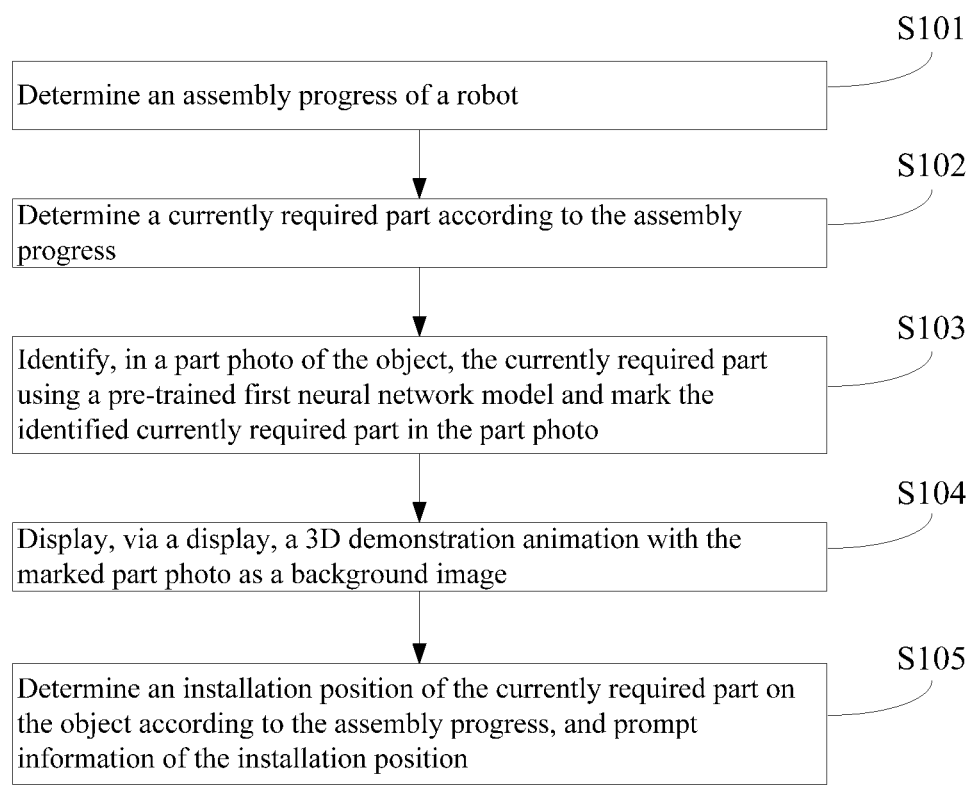
FIG. 6 is a flow chart of another embodiment of a method for constructing parts together according to the present disclosure.

FIG. 6 is a flow chart of another embodiment of a method for constructing parts together according to the present disclosure. As shown in FIG. 6, another assembly auxiliary method for a robot (e.g., a humanoid robot) constructed of a plurality of assemblable parts is provided. In other embodiments, the method can be used to construct parts of another kind of object constructed of a plurality of assemblable parts (e.g., furniture).

The difference between this embodiment and the previous embodiment is that, this embodiment adds an installation prompt to the 3D demonstration animation on the basis of the previous embodiment.

After the step S104, the method may further include step S105:

determining an installation position of the currently required part on the object according to the assembly progress, and prompting information of the installation position.

Since in the current 3D demonstration animation, after the user finds the currently required part, she or he may not know where to install it, while needs to switch to the next assembly step of the demonstration animation or view the assembly process in the product manual of the robot so as to know where to install the part on the robot, which brings great inconvenience to the user.

In this embodiment, after the marked part photo is displayed as the background image of the 3D demonstration animation, in order to allow the user to more clearly see the specific installation position of the currently required part from the 3D demonstration animation, it can determine the installation position of the currently required part and generate the installation prompt information of the installation position, and finally display the installation prompt information on the display interface, that is, displaying the installation position of the currently required part on the display interface in a highlighted manner.

In this embodiment, it enables the user to visually see the specific installation position of the currently required part by highlighting the installation position of the currently required part on the display interface without switching to the next assembly step of the 3D demonstration animation, thereby facilitating the assembly of the robot for users so as to improve the efficiency of assembly.

It should be understood that, the sequence of the serial number of the steps in the above-mentioned embodiments does not mean the execution order while the execution order of each process should be determined by its function and internal logic, which should not be taken as any limitation to the implementation process of the embodiments.

FIG. 7 is a schematic block diagram of an embodiment of an apparatus for constructing parts together according to the present disclosure. In this embodiment, an assembly auxiliary apparatus 7 for a robot (e.g., a humanoid robot) constructed of a plurality of assemblage parts is provided. The assembly auxiliary apparatus 7 has a camera and a display, which may be a standalone device, or be applied to a terminal device shown in FIG. 8. The assembly auxiliary apparatus 7 corresponds to the above-mentioned method for constructing parts together of FIG. 1. In other embodiments, the apparatus can be used to construct parts of another kind of object constructed of a plurality of assemblage parts (e.g., furniture). As shown in FIG. 7, the assembly auxiliary apparatus 7 for a robot includes:

a progress determining module 71 configured to determine an assembly progress of the robot;

a part determining module 72 configured to determine a currently required part according to the assembly progress;

an identification module 73 configured to identify, in a part photo of the object, the currently required part using a pre-trained first neural network model and mark the identified currently required part in the part photo; and a display module 74 configured to display, via a display, a 3D demonstration animation with the marked part photo as a background image.

In this embodiment, the apparatus 7 further includes a prompt information generating module 75 configured to determine an installation position of the currently required part on the object according to the assembly progress, and prompt information of the installation position.

In one embodiment, the progress determining module 71 is configured to determine the assembly progress of the robot based on a robot photo of each assembly step of the robot using a pre-trained second neural network model.

In one embodiment, the identification module 73 is configured to mark all the parts in the part photo that have a visual similarity greater than a preset similarity threshold and select the part with the highest similarity as the currently required part, if the similarities of a plurality of the recognized parts are greater than the preset similarity threshold.

In this embodiment, each of the above-mentioned modules/units is implemented in the form of software, which can be computer program(s) stored in a memory of the assembly auxiliary apparatus 7 and executable on a processor of the assembly auxiliary apparatus 7. In other embodiments, each of the above-mentioned modules/units may be implemented in the form of hardware (e.g., a circuit of the assembly auxiliary apparatus 7 which is coupled to the processor of the impedance control apparatus) or a combination of hardware and software (e.g., a circuit with a single chip microcomputer).

FIG. 8 is a schematic diagram of a terminal device according to an embodiment of the present disclosure. As shown in FIG. 8, in this embodiment, the terminal device 8 includes a processor 80, a storage 81, a computer program 82 stored in the storage 81 and executable on the processor 80, for example, a robot assembly auxiliary program, a camera 83, and a display 84 such as a display screen or a device for holography, VR or AR. When executing (instructions in) the computer program 82, the processor 80 implements the steps in the above-mentioned embodiments of the method for constructing parts together, for example, steps S101-S104 shown in FIG. 1. Alternatively, when the processor 80 executes the (instructions in) computer program 82, the functions of each module/unit in the above-mentioned device embodiments, for example, the functions of the modules 71-74 shown in FIG. 7 are implemented.

Exemplarily, the computer program 82 may be divided into one or more modules/units, and the one or more modules/units are stored in the storage 81 and executed by the processor 80 to realize the present disclosure. The one or more modules/units may be a series of computer program instruction sections capable of performing a specific function, and the instruction sections are for describing the execution process of the computer program 82 in the terminal device 8. For example, the computer program 82 can be divided into a progress determining module, a part determining module, an identification module configured, and a display module. The function of each module is as follows:

the progress determining module is configured to determine an assembly progress of the robot;

the part determining module is configured to determine a currently required part according to the assembly progress;

the identification module is configured to identify, in a part photo of the object, the currently required part using a pre-trained first neural network model and mark the identified currently required part in the part photo; and the display module is configured to display, via a display, a 3D demonstration animation with the marked part photo as a background image.

The terminal device 8 may be a computing device such as a desktop computer, a notebook computer, a tablet computer, and a cloud server. The terminal device 8 may include, but is not limited to, the processor 80 and the storage 81. It can be understood by those skilled in the art that FIG. 8 is merely an example of the terminal device 8 and does not constitute a limitation on the terminal device 8, and may include more or fewer components than those shown in the figure, or a combination of some components or different components. For example, the terminal device 8 may further include an input/output device, a network access device, a bus, and the like.

The processor 80 may be a central processing unit (CPU), or be other general purpose processor, a digital signal processor (DSP), an application specific integrated circuit (ASIC), a field-programmable gate array (FPGA), or be other programmable logic device, a discrete gate, a transistor logic device, and a discrete hardware component. The general purpose processor may be a microprocessor, or the processor may also be any conventional processor.

The storage 81 may be an internal storage unit of the terminal device 8, for example, a hard disk or a memory of the terminal device 8. The storage 81 may also be an external storage device of the terminal device 8, for example, a plug-in hard disk, a smart media card (SMC), a secure digital (SD) card, flash card, and the like, which is equipped on the terminal device 8. Furthermore, the storage 81 may further include both an internal storage unit and an external storage device, of the terminal device 8. The storage 81 is configured to store the computer program 82 and other programs and data required by the terminal device 8. The storage 81 may also be used to temporarily store data that has been or will be output.

Those skilled in the art may clearly understand that, for the convenience and simplicity of description, the division of the above-mentioned functional units and modules is merely an example for illustration. In actual applications, the above-mentioned functions may be allocated to be performed by different functional units according to requirements, that is, the internal structure of the device may be divided into different functional units or modules to complete all or part of the above-mentioned functions. The functional units and modulus in the embodiments may be integrated in one processing unit, or each unit may exist alone physically, or two or more units may be integrated in one unit. The above-mentioned integrated unit may be implemented in the form of hardware or in the form of software functional unit. In addition, the specific name of each functional unit and module is merely for the convenience of distinguishing each other and are not intended to limit the scope of protection of the present disclosure. For the specific operation process of the units and modules in the above-mentioned system, reference may be made to the corresponding processes in the above-mentioned method embodiments, and are not described herein.

In the above-mentioned embodiments, the description of each embodiment has its focuses, and the parts which are not described or mentioned in one embodiment may refer to the related descriptions in other embodiments.

Those ordinary skilled in the art may clearly understand that, the exemplificative units and steps described in the embodiments disclosed herein may be implemented through electronic hardware or a combination of computer software and electronic hardware. Whether these functions are implemented through hardware or software depends on the specific application and design constraints of the technical schemes. Those ordinary skilled in the art may implement the described functions in different manners for each particular application, while such implementation should not be considered as beyond the scope of the present disclosure.

In the embodiments provided by the present disclosure, it should be understood that the disclosed apparatus/terminal device and method may be implemented in other manners. For example, the above-mentioned apparatus/terminal device embodiment is merely exemplary. For example, the division of modules or units is merely a logical functional division, and other division manner may be used in actual implementations, that is, multiple units it components may be combined or be integrated into another system, or some of the features may be ignored or not performed. In addition, the shown or discussed mutual coupling may be direct coupling or communication connection, and may also be indirect coupling or communication connection through some interfaces, devices or units, and may also be electrical, mechanical or other forms.

The units described as separate components may or may not be physically separated. The components represented as units may or may not be physical units, that is may be located in one place or be distributed to multiple network units. Some or all of the units may be selected according to actual needs to achieve the objectives of this embodiment.

In addition, each functional unit in each of the embodiments of the present disclosure may be integrated into one processing unit, or each unit may exist alone physically, or two or more units may be integrated in one unit. The above-mentioned integrated unit may be implemented in the form of hardware or in the form of software functional unit.

When the integrated module/unit is implemented in the form of a software functional unit and is sold or used as an independent product, the integrated module/unit may be stored in a non-transitory computer-readable storage medium. Based on this understanding, all or part of the processes in the method for implementing the above-mentioned embodiments of the present disclosure are implemented, and may also be implemented by instructing relevant hardware through a computer program. The computer program may be stored in a non-transitory computer-readable storage medium, which may implement the steps of each of the above-mentioned method embodiments when executed by a processor. In which, the computer program includes computer program codes which may be the form of source codes, object codes, executable files, certain intermediate, and the like. The computer-readable medium may include any primitive or device capable of carrying the computer program codes, a recording medium, a USB flash drive, a portable hard disk, a magnetic disk, an optical disk, a computer memory, a read-only memory (ROM), a random access memory (RAM), electric carrier signals, telecommunication signals and software distribution media. It should be noted that the content contained in the computer readable medium may be appropriately increased or decreased according to the requirements of legislation and patent practice in the jurisdiction. For example, in some jurisdictions, according to the legislation and patent practice, a computer readable medium does not include electric carrier signals and telecommunication signals.

The above-mentioned embodiments are merely intended for describing but not for limiting the technical schemes of the present disclosure. Although the present disclosure is described in detail with reference to the above-mentioned embodiments, it should be understood by those skilled in the art that, the technical schemes in each of the above-mentioned embodiments may still be modified, or some of the technical features may be equivalently replaced, while these modifications or replacements do not make the essence of the corresponding technical schemes depart from the spirit and scope of the technical schemes of each of the embodiments of the present disclosure, and should be included within the scope of the present disclosure.

What is claimed is:

1. A computer-implemented method tier constructing parts together, comprising executing on a processor steps of:
    determining an assembly progress of an object constructed of two or more parts;
    determining one or more currently required parts of the object according to the assembly progress;
    capturing, by a camera, a part photo of the object;
    identifying, in the part photo of the object, the one or more currently required parts, using a pre-trained first neural network model;
    in response to the one or more currently required parts being identified in the part photo, marking the one or more identified currently required parts in the part photo, and displaying, via a display, a 3D demonstration animation with the marked part photo as a background image, wherein a foreground image of the 3D demonstration animation comprises a 3D animation for demonstrating the assembly progress of the object; and
    in response to the one or more currently required parts not being identified in the part photo, adjusting a shooting angle of the camera and returning the step of capturing, by the camera, the part photo of the object.

2. The method of claim 1, wherein the step of determining the assembly progress of the object constructed of two or more parts comprises:
    determining the assembly progress of the object constructed of two or more parts based on an object photo taken for each assembly step of the object using a pre-trained second neural network model.

3. The method of claim 2, wherein before the step of determining the assembly progress of the object constructed of two or more parts further comprises:
    capturing, by the camera, a plurality of object photos of each assembly step of the object from different shooting angles, wherein each assembly step of the object is to add one part to the object; and
    obtaining the pre-trained second neural network model by taking the plurality of captured object photos of each assembly step of the object as an input of the second neural network model and training the second neural network model with the assembly step as a label.

4. The method of claim 1, wherein the pre-trained first neural network model takes the part photos, captured by a camera, according to different shooting angles of each part, as an input of the first neural network model for training the first neural network model with an identifier of the part as a label.

5. The method of claim 1, wherein the step of identifying the one or more currently required parts in the part photo captured by the camera using the pre-trained first neural network model comprises:
    determining whether visual similarities of a plurality of the recognized parts are greater than a preset similarity threshold;
    the step of marking the one or more identified currently required parts in the part photo comprises:
    marking all the parts in the part photo having the visual similarity greater than the preset similarity threshold and selecting the part with the highest similarity as the currently required part, in response to the similarities of a plurality of the recognized parts being greater than the preset similarity threshold.

6. The method of claim 5, wherein the part with the highest similarity has a different marking than other parts in the part photo having the visual similarity greater than the preset similarity threshold.

7. The method of claim 1, wherein after the step of displaying the marked part photo as the background image of the 3D demonstration animation comprises:
    determining an installation position of the currently required part on the object according to the assembly progress, and prompting information of the installation position.

8. The method of claim 7, wherein the 3D animation for demonstrating the assembly progress of the object is a built-in 3D animation comprising a model photo of the object, and a model photo of a currently required part; and
    wherein the step of prompting information of the installation position comprises;
    generating installation prompt information of the installation position, and displaying, via the display, the installation prompt information in a highlighted manner.

9. The method of claim 1, wherein the part photo of the object is a picture of at least the one or more currently required parts in an arranged or non-arranged manner.

10. The method of claim 1, wherein before the step of determining the assembly progress of the object constructed of two or more parts, further comprises:
    displaying, via the display, a built-in 3D demonstration animation comprising the 3D animation for demonstrating the assembly progress of the object;
    the step of determining the assembly progress of the object constructed of two or more parts comprises:
    determining the assembly progress of the object based on the built-in 3D demonstration animation.

11. The method of claim 1, wherein the step of determining the one or more currently required parts of the object according to the assembly progress comprises:
    determining a shape of the object in a next assembly step according to the assembly progress; and determining the one or more currently required parts of the object according to the shape of the object in the next assembly step.

12. An apparatus for constructing parts together, comprising:
a progress determining module configured to determine an assembly progress of an object constructed of two or more parts;
a part determining module configured to determine one or more currently required parts of the object according to the assembly progress;
an identification module configured to capture, by a camera, a part photo of the object, identify, in the part photo of the object, the one or more currently required parts using a pre-trained first neural network model, in response to the one or more currently required parts being identified in the part photo, mark the one or more identified currently required parts in the part photo, and in response to the one or more currently required parts not being identified in the part photo, adjust a shooting angle of the camera and capture the part photo of the object; and
a display module configured to display, via a display of the apparatus, a 3D demonstration animation with the marked part photo as a background image, wherein a foreground image of the 3D demonstration animation comprises a 3D animation for demonstrating the assembly progress of the object.

13. The apparatus of claim 12, further comprising:
a prompt information generating module configured to determine an installation position of the currently required part on the object according to the assembly progress, and prompt information of the installation position.

14. A terminal device, comprising:
a camera;
a display;
a memory;
a processor; and
one or more computer programs stored in the memory and executable on the processor, wherein the one or more computer programs comprise:
instructions for determining an assembly progress of an object constructed of two or more parts;
instructions for determining one or more currently required parts of the object according to the assembly progress;
instructions for capturing, by the camera, a part photo of the object;
instructions for identifying, in the part photo of the object, the one or more currently required parts using a pre-trained first neural network model;
instructions for in response to the one or more currently required parts being identified in the part photo, marking the one or more identified currently required parts in the part photo;
instructions for displaying, via the display, a 3D demonstration animation with the marked part photo as a background image, wherein a foreground image of the 3D demonstration animation comprises a 3D animation for demonstrating the assembly progress of the object; and
instructions for in response to the one or more currently required parts not being identified in the part photo, adjusting a shooting angle of the camera and returning the step of capturing, by the camera, the part photo of the object.

15. The terminal device of claim 14, wherein the instructions for determining the assembly progress of the object constructed of two or more parts comprise:
instructions for determining the assembly progress of the object constructed of two or more parts based on an object photo of each assembly step of the object using a pre-trained second neural network model.

16. The terminal device of claim 15, wherein the one or more computer programs further comprise:
instructions for capturing, by the camera, a plurality of object photos of each assembly step of the object from different shooting angles, wherein each assembly step of the object is to add one part to the object; and
instructions for obtaining the pre-trained second neural network model by taking the plurality of captured object photos of each assembly step of the object as an input of the second neural network model and training the second neural network model with the assembly step as a label.

17. The terminal device of claim 14, wherein the pre-trained first neural network model takes the part photos according to different shooting angles of each part captured by a camera as an input of the first neural network model to perform a training on the first neural network model with an identifier of the part as a label.

18. The terminal device of claim 14, wherein the one or more computer programs further comprise:
instructions for determining whether visual similarities of a plurality of the recognized parts are greater than a preset similarity threshold; and
instructions for marking all the parts in the part photo having the visual similarity greater than the preset similarity threshold and selecting the part with the highest similarity as the currently required part, in response to the similarities of a plurality of the recognized parts being greater than the preset similarity threshold.

19. The terminal device of claim 14, wherein the one or more computer programs further comprise:
instructions for determining an installation position of the currently required part on the object according to the assembly progress, and prompting information of the installation position.

20. The terminal device of claim 14, wherein the part photo of the object is a picture of at least the one or more currently required parts in an arranged or non-arranged manner.

* * * * *